United States Patent [19]

Imanaka et al.

[11] Patent Number: 5,078,802
[45] Date of Patent: Jan. 7, 1992

[54] METHOD OF WASHING SUPER PRECISION DEVICES, SEMICONDUCTORS, WITH ENZYMES

[75] Inventors: Tadayuki Imanaka, Suita; Shoji Sakurai, Shizuoka, both of Japan

[73] Assignee: Nikko Bio Technica Co., Ltd., Shizuoka, Japan

[21] Appl. No.: 283,130

[22] Filed: Dec. 12, 1988

[30] Foreign Application Priority Data

Dec. 12, 1987 [JP]  Japan .................................. 63-315021

[51] Int. Cl.$^5$ ................................................ B08B 3/00
[52] U.S. Cl. ............................ 134/42; 252/DIG. 12; 252/174.12; 134/25.1
[58] Field of Search .................. 252/DIG. 12, 174.12; 134/25.1, 25.4, 42, 1, 184, 42

[56] References Cited

U.S. PATENT DOCUMENTS

| | | | |
|---|---|---|---|
| Re. 32,672 | 5/1988 | Huth et al. | 252/DIG. 12 |
| 4,690,773 | 9/1987 | Ogumbiyl et al. | 252/174.12 |
| 4,736,759 | 4/1988 | Coberly et al. | 134/184 |
| 4,749,511 | 6/1988 | Lad et al. | 252/174.12 |
| 4,921,630 | 5/1990 | Bhatia | 252/174.12 |

Primary Examiner—Asok Pal
Attorney, Agent, or Firm—Bacon & Thomas

[57] ABSTRACT

Disclosed is a method of super precision devices such as semiconductor devices. In the method of the present invention, the devices are washed with an aqueous solution containing a purified proteolytic enzyme, poly(oligo)saccharide-decomposing enzyme, or a lipid or oil-decomposing enzyme.

15 Claims, No Drawings

METHOD OF WASHING SUPER PRECISION DEVICES, SEMICONDUCTORS, WITH ENZYMES

BACKGROUND OF THE INVENTION

I. Field of the Invention

This invention relates to a method of very precisely washing super precision devices such as semiconductor devices.

II. Description of the Related Art

General process of producing semiconductor devices comprises a first group of steps for preparing silicon wafers from monocrystalline silicon, a second group of steps for forming a desired pattern on the wafer, and a third group of steps for wiring, forming electrodes and testing the completed devices. Each group of steps includes several to several tens of steps, and washing is generally performed between each of the steps.

The contaminants which may be contaminated in the semiconductor devices during the manufacturing process thereof includes (1) organic materials such as dandruff, skin grime and saliva from the workers, oil such as grinding oil and lubricant, waste thread, paper, photoresist, mist, bacteria in pure water for rinsing, and particles contaminated in reagents used; (2) inorganic materials such as abradings of the wafer, dusts produced by chipping of the wafer, metal particles produced by the abrasion of apparatuses; and (3) elements and ions such as alkali metals, heavy metals, oxygen, carbon, radioactive Na and $U^{235}$; as well as the bacteria which assimilate the organic additives of the polyvinyl chloride used as the pipings of the apparatus and Na, C, N, P, S and K originating therefrom. Among these, those which are most difficult to wash off are said to be the organic contaminants (1). This is because that most of the organic contaminants are very small and usually have a size of 0.1 $\mu$m to 10 $\mu$m. Those contaminants with a size less than 0.1 $\mu$m are not so rare and some contaminants are of molecular size. Such fine organic contaminants are often firmly bound to the semiconductor devices and are difficult to remove. Recent semiconductor devices are highly integrated and a great number of fine grooves, holes and ribs are three-dimensionally and complicatedly combined. If the organic contaminants enter such fine grooves or holes, it is very difficult to remove the contaminants. This is a cause to degrade the yield of the semiconductor devices, which is currently said to be 20%-60%. The difficulty in removing such a contaminant can be compared to the difficulty in removing several contaminants with a size of a small coin in somewhere in the grooves with a width of 1 cm and a depth of 5 cm among the 1,000,000 grooves formed in a baseball stadium.

The washing of the semiconductor devices is conventionally conducted by washing the devices with super pure water or with an organic solvent such as trichloroethylene. However, fine organic contaminants as described above cannot be well removed by this method. Further, the use of organic solvents as washing liquid is restricted because of the problem of the environment pollution.

SUMMARY OF THE INVENTION

Accordingly, the object of the present invention is to provide a method of washing super precision devices such as semiconductor devices by which the fine organic contaminants can effectively be removed and which does not bring about a problem of environmental pollution.

The present inventors intensively studied to find that the organic contaminants having even the size of a molecule can be removed by washing the device with an aqueous solution containing a purified enzyme, so that the yield of the production of super precision devices can be promoted to complete the present invention.

That is, the present invention provides a method of washing super precision devices comprising washing the device with an aqueous solution containing a purified proteolytic enzyme, poly(oligo)saccharide-decomposing enzyme, or a lipid or oil-decomposing enzyme. The term "purified" means that the enzyme, when subjected to SDS-polyacrylamide gel electrophoresis followed by Coomassie Briliant Blue dying or phosphate dying, exhibits a single band. In the best mode, the enzyme is in the form of crystal.

The preferred examples of the proteolytic enzyme which may be used in the present invention include acidic, neutral and alkalline protease. The preferred examples of the proteolytic enzyme which may be used in the present invention include amylase, pullulanase, xylanase and cellulase which are produced by various microorganisms. The preferred examples of the proteolytic enzyme which may be used in the present invention include lipase produced by various microorganisms. It should be noted that both of the enzymes produced by fermentation process and produced by genetic engineering process may be used.

In the method of the present invention, at least one aqueous solution containing at least one of the above three groups of enzyme, i.e., proteolytic enzyme, poly(oligo)saccharide-decomposing enzymes and lipid or oil-decomposing enzymes is used. In the preferred mode of the invention, the devices are washed using the all of the three kinds of enzymes. The washing may be conducted successively using the three kinds of aqueous solution each containing one of the above groups of enzymes. Alternatively, the washing may be conducted using an aqueous solution containing all of the three kinds of enzymes. By using an aqueous solution containing a plurality of groups of enzymes, the total washing time can be shortened. Further, the enzymes exhibit a synergistic effect for removing the organic contaminants. However, since the proteolytic enzyme may decompose other enzymes, it is preferred to separately use the proteolytic enzyme. Therefore, even in cases where an aqueous solution containing a plurality of groups of enzymes is used, it is preferred to separately prepare the solution containing the proteolytic enzyme and the solution containing the other enzymes and to conduct the washing successively. Further, because of the same reason, in cases where the washing is conducted successively using two or three aqueous solutions, it is preferred to conduct the washing with the solution containing the proteolytic enzyme last. By so doing, the step of eluting the enzyme with water after each washing step may be omitted. Further, the washing solution may contain two or more proteolytic enzymes, poly(oligo)saccharide-decomposing enzymes and lipid or oil-decomposing enzymes, respectively. In particular, the solution containing the sugar related enzyme preferably contains amylase, and more preferably contains xylanase, pullulanase and/or cellulase in addition to amylase.

The enzyme level in the aqueous enzyme solution is not restricted as long as the enzyme can exhibit its ability, and may usually be 1 μg/l to 1 g/l. In view of the fact that the washing time may be shortened by using a solution with higher enzyme level, the enzyme level may preferably be 1 mg/l to 1 g/l. The washing time varies depending on the enzyme level employed and the nature of the enzyme. The washing time is usually at least 5 minutes and may be, for example, about 15 minutes to 1 hour.

The washing may be accomplished by simply immersing the super precision devices in the aqueous enzyme solution. It is preferred to apply ultrasonic wave to the aqueous enzyme solution because the effect of washing is further promoted.

It is preferred to use ultrapure water as the solvent for the aqueous enzyme solution because it does not substantially contain contaminants such as dusts and other particles.

It is preferred to wash the device with water, preferably with ultrapure water in the conventional manner after the washing with the aqueous enzyme solution. By so doing, since the enzyme is water-soluble and the organic contaminants have been decomposed with the enzymes, the enzymes and the decomposed products of the organic contaminants are readily removed.

In the preferred mode of the invention, thermostable enzymes originating from thermophilic bacteria are employed and the washing is conducted at a temperature not lower than 40° C. Those enzymes produced by the bacteria belonging to the genera Thermus, Bacillus and Clostridium may preferably be used. The temperature at which the washing is conducted may preferably be not lower than 40° C. and is lower than the temperature at which the enzyme is deactivated. Since the growing temperature range of thermophilic bacteria is generally 45° C. to 60° C., it is preferred to conduct the washing within this temperature range. The semiconductor devices are not damaged by the temperature of about 60° C. at all. By conducting the washing step at such a high temperature, the growth of bacteria in the aqueous enzyme solution can be prevented.

Needless to say, however, the method of the present invention can also be conducted using enzymes other than thermostable enzymes and at room temperature.

In the method of the present invention employing an aqueous enzyme solution, since the size of the enzymes is about 1 nm to 10 nm which is much smaller than the grooves and holes of super large scale integrated circuits and the like, the enzymes can easily enter the grooves and the holes of the devices. Further, since the enzymes have a strong power to decompose the organic contaminants, they can decompose and remove even the organic contaminants with a size of as small as a molecule, which are strongly bound to the semiconductor device. Therefore, by employing the method of the present invention, the production yield of the semiconductor devices may be promoted. Further, since the method of the present invention does not utilize an organic solvent, the problem of environmental pollution is not brought about. Thus, the method of the present invention will highly contribute to the field of the semiconductor device or the like.

We claim:

1. A method of method of washing semiconductor devices comprising washing the devices with an aqueous solution containing a purified proteolytic enzyme, poly(oligo)saccharide-decomposing enzyme, or a lipid or oil-decomposing enzyme.

2. The method of claim 1, wherein the solvent of the aqueous solution is ultrapure water.

3. The method of claim 1, wherein the washing of the devices is successively conducted using separate aqueous solutions each containing a proteolytic enzyme, poly(oligo)saccharide-decomposing enzyme or a lipid or oil-decomposing enzyme, respectively.

4. A method according to claim 3 wherein the proteolytic enzyme is anylase, pullalnase, xylanase or cellulase.

5. The method of claim 1, wherein the washing is successively conducted using a first aqueous solution containing the poly(oligo)saccharide-decomposing enzyme and the lipid or oil-decomposing enzyme, and a second aqueous solution containing the proteolytic enzyme.

6. The method of claim 1, wherein the aqueous solution contains all of the proteolytic enzyme, poly(oligo)saccharide-decomposing enzyme and the lipid or oil-decomposing enzyme.

7. The method of claim 1, wherein the enzyme is in the form of crystal before being dissolved in the aqueous solution.

8. The method of claim 1, wherein the enzymes are thermostable enzymes and the washing is conducted at a temperature not lower than 40° C.

9. The method of claim 1, wherein the washing is conducted at a temperature of 45° C.-60° C.

10. The method of claim 1, wherein the washing is conducted while applying ultrasonic wave to the aqueous solution.

11. A method of washing fine organic contaminants from semiconductor devices comprising washing the devices with an aqueous solution containing a purified proteolytic enzyme, poly(oligo)saccharide-decomposing enzyme, or a lipid- or oil-decomposing enzyme.

12. A method according to claim 11 wherein the organic contaminants have a size of 0.1 μm to 10 μm.

13. A method according to claim 11 wherein the organic contaminants have a size of less than 0.1 μm.

14. A method according to claim 13 wherein the organic contaminants are of molecular size.

15. A method according to claim 12 wherein the organic contaminants are located in three dimensional, fine grooves, holes and ribs comprised within the semiconductor device.

* * * * *